(12) United States Patent
Nishihara et al.

(10) Patent No.: US 10,115,578 B2
(45) Date of Patent: Oct. 30, 2018

(54) WAFER AND METHOD OF PROCESSING WAFER

(71) Applicant: DISCO CORPORATION, Tokyo (JP)

(72) Inventors: Ryosuke Nishihara, Tokyo (JP); Jun Koide, Tokyo (JP); Kohei Tsujimoto, Tokyo (JP); Minoru Matsuzawa, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/681,919

(22) Filed: Aug. 21, 2017

(65) Prior Publication Data

US 2018/0076016 A1 Mar. 15, 2018

(30) Foreign Application Priority Data

Sep. 9, 2016 (JP) .................. 2016-176879

(51) Int. Cl.
*H01L 21/02* (2006.01)
*H01L 21/304* (2006.01)
*H01L 21/78* (2006.01)

(52) U.S. Cl.
CPC ...... *H01L 21/02013* (2013.01); *H01L 21/304* (2013.01); *H01L 21/78* (2013.01)

(58) Field of Classification Search
CPC .. H01L 21/02013; H01L 21/78; H01L 21/304
USPC .......................................................... 257/618
See application file for complete search history.

(56) References Cited

FOREIGN PATENT DOCUMENTS

| JP | 2007-019461 | 1/2007 |
|----|-------------|--------|
| JP | 2008-053341 | 3/2008 |
| JP | 2011-054808 | 3/2011 |

*Primary Examiner* — Anthony Ho
(74) *Attorney, Agent, or Firm* — Greer Burns & Crain Ltd.

(57) ABSTRACT

A method of processing a wafer having on a face side thereof a device area with a plurality of devices formed therein and an outer circumferential excess area surrounding the device area includes a grinding step for grinding a reverse side of the wafer corresponding to the device area with a grinding wheel that is smaller in diameter than the wafer, thereby forming a first portion corresponding to the device area and an annular second portion surrounding the first portion, the annular second portion being thicker and more protrusive toward a reverse side thereof than the first portion. In the grinding step, the grinding wheel and the wafer are moved relatively to each other so that the angle formed between the reverse side of the first portion and an inner side surface of the annular second portion is larger than 45° and smaller than 75°.

2 Claims, 4 Drawing Sheets

WAFER AND METHOD OF PROCESSING WAFER

BACKGROUND OF THE INVENTION

Field of the Invention

The present invention relates to a wafer and a method of processing a wafer.

Description of the Related Art

In recent years, it has been required to process a wafer made of a material such as silicon, gallium arsenide, or the like to a thin profile in order to realize small and light device chips. Specifically, after devices such as integrated circuits (ICs) or the like have been formed in respective areas demarcated by projected dicing lines or streets on the face side of a wafer, the reverse side of the wafer is ground until the wafer is thinned to a desired thickness. When a wafer is thinned by grinding or the like, the rigidity of the wafer is greatly reduced, making the wafer difficult to handle in subsequent steps. In view of this difficulty, there has been proposed a processing method in which only the central portion of a wafer with devices formed thereon is ground to keep the wafer thick in an outer circumferential portion thereof, leaving the ground wafer rigid to a certain extent (see, for example, Japanese Patent Laid-open No. 2007-19461). According to the proposed processing method, the reverse side of the wafer is ground using a grinding wheel that is smaller in diameter than the wafer, thinning the central portion of the wafer. The rigidity of the wafer is kept by the outer circumferential portion thereof whose thickness is maintained. The outer circumferential portion will subsequently be separated and removed by irradiating the boundary between the outer circumferential portion and the central portion with a laser beam (see, for example, Japanese Patent Laid-open No. 2008-53341).

If the reverse side of the central portion of the wafer and an inner side surface of the outer circumferential portion, i.e., a side surface near the central portion of the wafer, lie perpendicularly to each other due to the grinding of the reverse side of the central portion of the wafer, the edge of inner side surface of the outer circumferential portion tends to be chipped off during subsequent handling of the wafer. When the wafer where the edge of inner side surface of the outer circumferential portion has been chipped off is treated by etching or the like, the outer circumferential portion is progressively eroded from the chipped edge and becomes brittle and fragile. Furthermore, the inner side surface of the outer circumferential portion which lies perpendicularly to the reverse side of the central portion of the wafer makes it difficult for chemicals used in various processing steps, e.g., a resist solution used to form a redistribution line layer, to be drained out of the wafer. Because of these problems, there has recently been proposed a processing method for slanting the inner side surface of the outer circumferential portion of a wafer with respect to the reverse side of the central portion of the wafer (see, for example, Japanese Patent Laid-open No. 2011-54808).

SUMMARY OF THE INVENTION

However, slanting the inner side surface of the outer circumferential portion with respect to the reverse side of the central portion is liable to reduce the central portion so much that the wafer fails to provide a sufficient space required to form devices therein. In addition, the edge of the inner side surface of the outer circumferential portion is still likely to be chipped off by contact with grinding stones or the like that are used to grind the wafer.

It is an object of the present invention to provide a method of processing a wafer in a manner to prevent the wafer from being chipped off while keeping a wide area for forming devices therein on the wafer, and a wafer processed by such a method of processing a wafer.

In accordance with an aspect of the present invention, there is provided a wafer including a first portion having a plurality of devices on a face side thereof, and an annular second portion surrounding the first portion. The annular second portion is thicker and more protrusive toward a reverse side thereof than the first portion. An angle formed between the reverse side of the first portion and an inner side surface of the annular second portion is larger than 45° and smaller than 75°.

According to another aspect of the present invention, the angle formed between the reverse side of the first portion and the inner side surface of the annular second portion should preferably be equal to or larger than 55°, and equal to or smaller than 70°.

In accordance with still another aspect of the present invention, there is provided a method of processing a wafer having on a face side thereof a device area with a plurality of devices formed therein and an outer circumferential excess area surrounding the device area, including a grinding step for grinding a reverse side of the wafer corresponding to the device area with a grinding wheel that is smaller in diameter than the wafer, thereby forming a first portion corresponding to the device area and an annular second portion surrounding the first portion, the annular second portion being thicker and more protrusive toward a reverse side thereof than the first portion. In the grinding step, the grinding wheel and the wafer are moved relatively to each other so that an angle formed between the reverse side of the first portion and an inner side surface of the annular second portion is larger than 45° and smaller than 75°.

According to yet another aspect of the present invention, in the grinding step, the grinding wheel and the wafer should preferably be moved relatively to each other so that the angle formed between the reverse side of the first portion and the inner side surface of the annular second portion is equal to or larger than 55°, and equal to or smaller than 70°.

With the wafer and the method of processing a wafer according to the aspects of the present invention, since the angle formed between the reverse side of the first portion and the inner side surface of the annular second portion is larger than 45° and smaller than 75°, the wafer is prevented from being chipped off while keeping a wide area for the first portion corresponding to the device area.

The above and other objects, features and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

A method of processing a wafer according to a preferred embodiment of the present invention will be described in detail below with reference to the drawings. The method of processing a wafer according to the present embodiment includes a protective member applying step (see FIG. 1B), a first grinding step (see FIGS. 2A and 2B), and a second grinding step (see FIGS. 3A and 3B). In the protective member applying step, a protective member is applied to the face side of a wafer which has a device area where a plurality of devices are formed and an outer circumferential excess area surrounding the device area. In the first grinding step, the reverse side of the wafer which corresponds to the device area is ground using a grinding wheel that is smaller in diameter than the wafer, forming a thin first portion and a thick second portion surrounding the thin first portion. In the first grinding step, the grinding wheel is moved relatively to the wafer so that the reverse side of the first portion and an inner side surface of the second portion form an angle larger than 45° and smaller than 75° therebetween. In the second grinding step, the reverse side of the first portion is further ground using a grinding wheel that is different from the grinding wheel used in the first grinding step. The method of processing a wafer according to the present embodiment will be described in greater detail below.

Figure 1A:
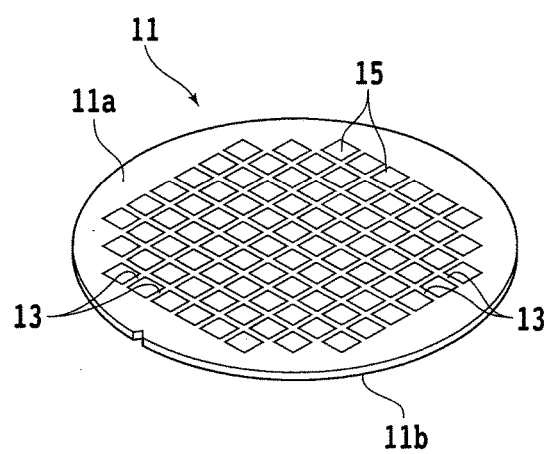
FIG. 1A is a schematic perspective view of a wafer to be processed by a method of processing a wafer according to an embodiment of the present invention.

FIG. 1A depicts in schematic perspective a wafer 11 to be processed by the method of processing a wafer according to the present embodiment. As depicted in FIG. 1A, the wafer 11 to be processed according to the present embodiment is of a disk shape, made of a semiconductor material such as silicon (Si), gallium arsenide (GaAs), or the like. The wafer 11 has a face side 11a separated into a central device area and an outer circumferential excess area surrounding the device area. The device area is demarcated into a plurality of areas by a grid-like array of projected dicing lines or streets 13, with devices 15 such as ICs, large scale integration (LSI) circuits, etc. formed in the respective areas. According to the present embodiment, the wafer 11 is disk-shaped and made of a semiconductor material. However, the wafer 11 is not limited to any materials, shapes, and structures, etc. The wafer 11 may be made of ceramics, metal, resin, or the like, for example. Similarly, the devices 15 are not limited to any types, numbers, and layouts, etc.

Figure 1B:
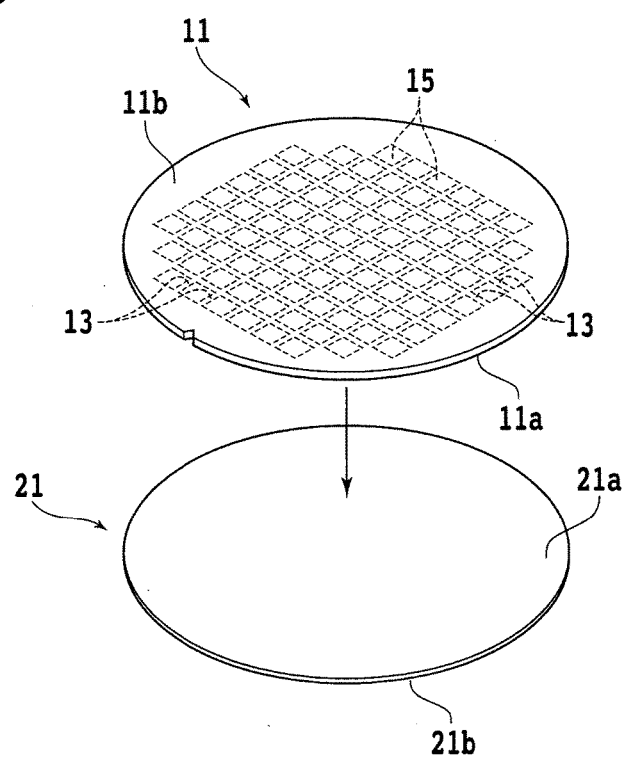
FIG. 1B is a schematic perspective view depicting a protective member applying step.

In the method of processing a wafer according to the present embodiment, the protective member applying step is carried out to apply a protective member 21 to the face side 11a of the wafer 11. FIG. 1B depicts in schematic perspective view the protective member applying step. The protective member 21 includes, for example, a circular film or tape having the same diameter as the wafer 11, and has an adhesive layer having adhesive power on its face side 21a. When the face side 21a of the protective member 21 is brought into intimate contact with the face side 11a of the wafer 11, the protective member 21 is applied to the wafer 11. The protective member 21 applied to the wafer 11 is effective to dampen shocks exerted to the wafer 11 in the first grinding step and the second grinding step, thereby protecting the devices 15 on the face side 11a of the wafer 11, for example.

Figure 2A:
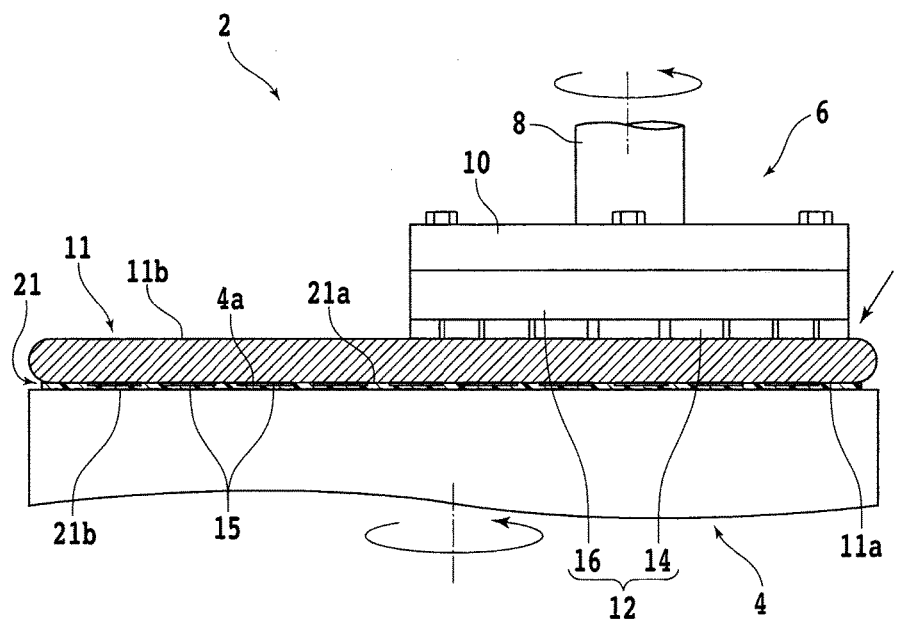
FIG. 2A is a side elevational view, partly in cross section, schematically depicting a first grinding step.
Figure 2B:
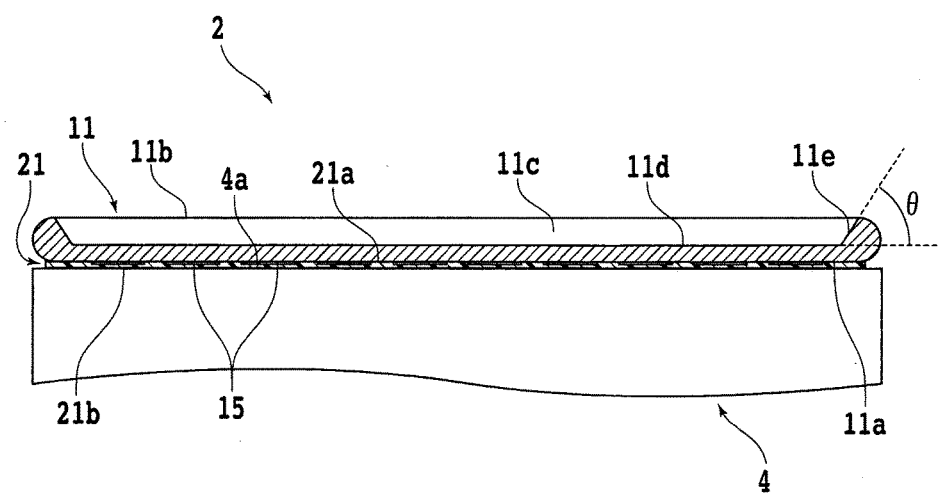
FIG. 2B is a side elevational view, partly in cross section, schematically depicting the wafer after being treated in the first grinding step.

The protective member applying step is followed by the first grinding step in which the reverse side 11b of the wafer 11 corresponding to the device area is ground to form a thin first portion and a thick second portion surrounding the first portion. FIG. 2A schematically depicts the first grinding step in side elevation, partly in cross section. FIG. 2B schematically depicts the wafer 11 after being treated in the first grinding step in side elevation, partly in cross section. The first grinding step is carried out using a grinding apparatus 2 depicted in FIG. 2A, for example. The grinding apparatus 2 has a chuck table 4 for holding the wafer 11 under suction. The chuck table 4 is coupled to a rotary drive source, not depicted, including a motor, etc., and is rotatable about a rotational axis extending substantially parallel to vertical directions. The grinding apparatus 2 also includes a moving mechanism, not depicted, disposed below the chuck table 4, for moving the chuck table 4 in horizontal directions. The chuck table 4 has an upper surface serving as a holding surface 4a for holding under suction the reverse side 21b of the protective member 21 applied to the wafer 11. The holding surface 4a is connected to a suction source, not depicted, through a suction channel, not depicted, defined in the chuck table 4. The wafer 11 is held under suction on the chuck table 4 through the protective member 21 when the suction source applies a negative pressure to the holding surface 4a.

The grinding apparatus 2 also includes a first grinding unit 6 disposed above the chuck table 4. The first grinding unit 6 has a spindle housing, not depicted, supported by a moving mechanism, not depicted. The spindle housing is movable horizontally and vertically by the moving mechanism. The spindle housing houses a spindle 8 that has a lower end to which a disk-shaped mount 10 is fixed. The first grinding unit 6 also has a grinding wheel 12 mounted on the lower surface of the mount 10 and having essentially the same diameter as the mount 10. The grinding wheel 12 includes a wheel base 14 made of a metal material such as stainless steel, aluminum, or the like and a plurality of grinding stones 16 arranged in annular pattern on the lower surface of the wheel base 14. The spindle 8 has an upper proximal end coupled to a rotary drive source, not depicted, such as a motor or the like. The grinding wheel 12 is rotatable about a rotational axis extending substantially parallel to vertical directions by rotational power generated by the rotary drive source. Nozzles, not depicted, for supplying a grinding liquid such as pure water or the like to the wafer 11 are provided in or near the first grinding unit 6.

In the first grinding step, the reverse side 21b of the protective member 21 applied to the wafer 11 is brought into contact with the holding surface 4a of the chuck table 4, and then the suction source exerts a negative pressure on the holding surface 4a. The wafer 11 is now held under suction on the chuck table 4, with the reverse side 11b being exposed upwardly. Then, the chuck table 4 is moved to a position beneath the first grinding unit 6, and the grinding wheel 12 brings its end, i.e., an outer side surface of the annular array of the grinding stones 16, into alignment with the boundary between the device area and the outer circumferential excess area. As depicted in FIG. 2A, the chuck table 4 and the grinding wheel 12 are rotated about their axes, and while the grinding liquid is being supplied to the reverse side 11b of the wafer 11, the spindle housing and hence the spindle 8 and the grinding wheel 12 are lowered. The rate of descent of the spindle housing, i.e., the distance that the spindle housing is lowered, is adjusted such that the lower surfaces of the grinding stones 16 are pressed against the reverse side 11b of the wafer 11. At the same time, the spindle housing and hence the spindle 8 and the grinding wheel 12 are moved horizontally toward the center of the wafer 11. In other words, the grinding wheel 12 and the wafer 11 are moved relatively to each other along a direction oblique to the horizontal and vertical directions.

In this manner, the reverse side 11b of the wafer 11 corresponding to the device area is ground to form a thin first portion 11c corresponding to the device area and a thick second portion 11d corresponding to the outer circumferential excess area, as depicted in FIG. 2B. The second portion 11d is of an annular shape surrounding the first portion 11c and is more protrusive toward the reverse side 11b of the wafer 11 than the first portion 11c. The first portion 11c has a reverse side 11e, and the second portion 11d has an inner side surface 11f, i.e., a side surface near the first portion 11c. The reverse side 11e and the inner side surface 11f form an angle θ therebetween depending on the relative movement of the grinding wheel 12 and the wafer 11. If the angle θ is 75° or larger, then the edge of the inner side surface 11f of the second portion 11d tends to be chipped off. If the angle θ is 45° or smaller, then the distance that the grinding wheel 12 and the wafer 11 are relatively moved horizontally in grinding the wafer 11 is increased, making it difficult to make the first portion 11c corresponding to the device area sufficiently large. According to the present embodiment, the angle θ is set to a value larger than 45° and smaller than 75°. Preferably, the angle θ should be set to a value equal to or larger than 55°, and equal to or smaller than 70°. This angle setting makes it possible to make the first portion 11c sufficiently large and prevent the edge of the inner side surface 11f from being chipped off.

Figure 3A:
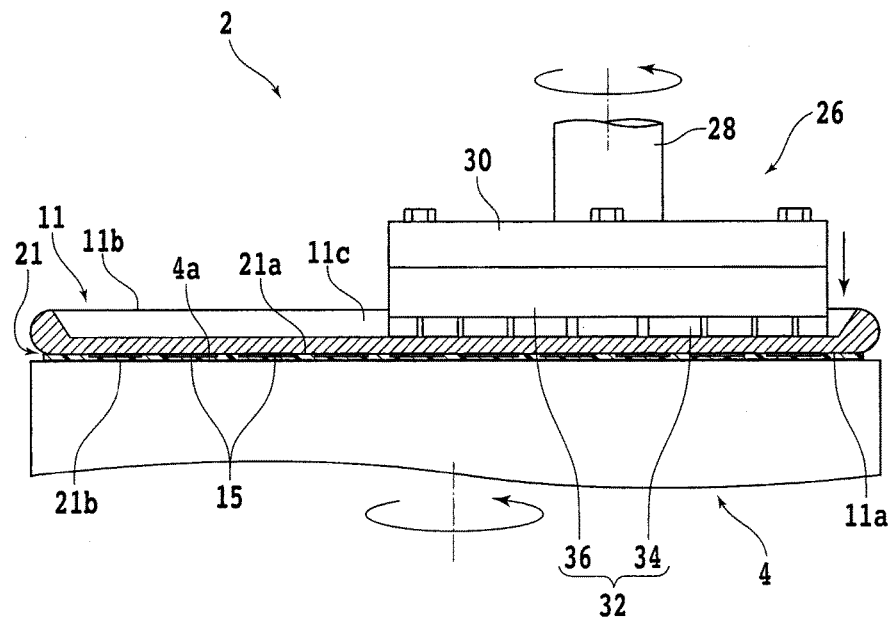
FIG. 3A is a side elevational view, partly in cross section, schematically depicting a second grinding step.
Figure 3B:
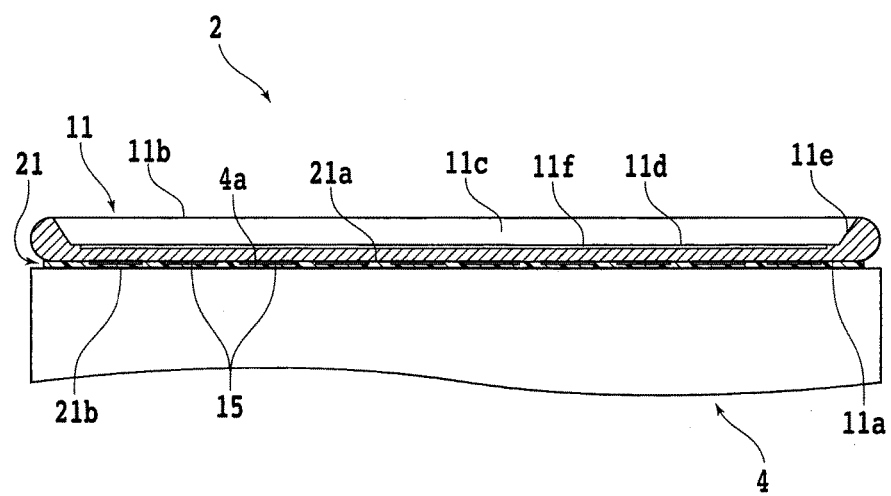
FIG. 3B is a side elevational view, partly in cross section, schematically depicting the wafer after being treated in the second grinding step.

The first grinding step is followed by the second grinding step in which the reverse side 11e of the first portion 11c is further ground using a grinding wheel that is different from the grinding wheel 12 used in the first grinding step. FIG. 3A depicts the second grinding step in side elevation, partly in cross section. FIG. 3B schematically depicts the wafer 11 after being treated in the second grinding step in side elevation, partly in cross section. The second grinding step is carried out still using the grinding apparatus 2. As depicted in FIG. 3A, the grinding apparatus 2 has a second grinding unit 26 different from the first grinding unit 6, disposed above the chuck table 4. The second grinding unit 26 is structurally similar to the first grinding unit 6. The second grinding unit 26 has a spindle housing, not depicted, supported by a moving mechanism, not depicted. The spindle housing is movable horizontally and vertically by the moving mechanism. The spindle housing houses a spindle 28 that has a lower end to which a disk-shaped mount 30 is fixed. The second grinding unit 26 also has a grinding wheel 32 mounted on the lower surface of the mount 30 and having essentially the same diameter as the mount 30. The grinding wheel 32 includes a wheel base 34 made of a metal material such as stainless steel, aluminum, or the like and a plurality of grinding stones 36 arranged in annular pattern on the lower surface of the wheel base 34. The grinding stones 36 contain abrasive grains smaller than those of the grinding stones 16 of the first grinding unit 6. The spindle 28 has an upper proximal end coupled to a rotary drive source, not depicted, such as a motor or the like.

The grinding wheel 32 is rotatable about a rotational axis extending substantially parallel to vertical directions by rotational power generated by the rotary drive source. Nozzles, not depicted, for supplying a grinding liquid such as pure water or the like to the wafer 11 are provided in or near the second grinding unit 26.

In the second grinding step, the chuck table 4 is moved to a position beneath the second grinding unit 26, and the grinding wheel 32 brings its end, i.e., an outer side surface of the annular array of the grinding stones 36, radially inward of the inner side surface 11f of the second portion 11d. Then, as depicted in FIG. 3A, the chuck table 4 and the grinding wheel 32 are rotated about their axes, and while the grinding liquid is being supplied to the reverse side 11b of the wafer 11, the spindle housing and hence the spindle 28 and the grinding wheel 32 are lowered. The rate of descent of the spindle housing, i.e., the distance that the spindle housing is lowered, is adjusted such that the lower surfaces of the grinding stones 36 are pressed against the reverse side 11e of the first portion 11c. In this manner, the first portion 11c of the wafer 11 is further ground to form a recess 11g therein which has a smoother bottom surface than the reverse side 11e, as depicted in FIG. 3B.

An experiment conducted in order to confirm the effectiveness of the method of processing a wafer according to the present embodiment will be described below. In the experiment, a plurality of wafers processed in the first grinding step and having different angles θ in the range from 30° to 90° were prepared. Grinding conditions except the angles θ for the first grinding step are given below. In the experiment, the rate of descent of the grinding wheel in actually grinding the wafers was changed in three stages, i.e., first through third speeds.

Figure 4:
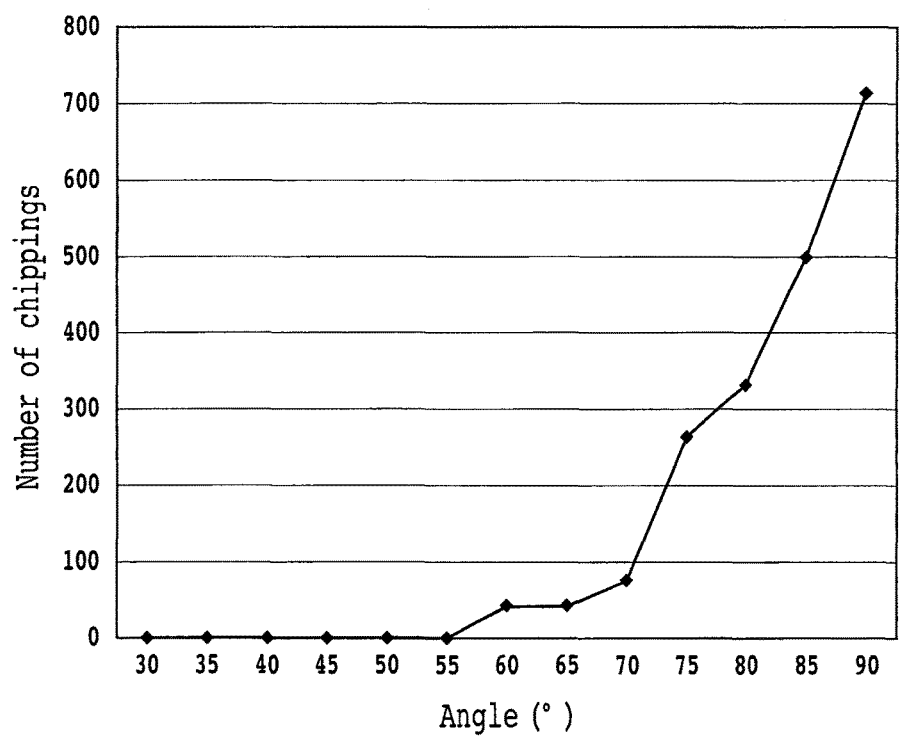
FIG. 4 is a graph schematically depicting the results of an experiment conducted on wafers.

Rotational speed of the spindle: 4500 rpm
Rotational speed of the chuck table: 300 rpm
Rate of descent of the grinding wheel (first speed): 6.0 μm/s
Rate of descent of the grinding wheel (second speed): 3.0 μm/s
Rate of descent of the grinding wheel (third speed): 1.0 μm/s
Rate of supply of the grinding liquid (first nozzle): 4.0 L/min
Rate of supply of the grinding liquid (second nozzle): 3.0 L/min Thereafter, the number of chippings off each of the wafers was confirmed. FIG. 4 is a graph depicting the results of the experiment conducted on the wafers. In FIG. 4, the horizontal axis represents the values of the angle θ and the vertical axis the number of chippings, so that the graph indicates the relationship between the angle θ and the number of chippings whose sizes are 100 μm or larger. As depicted in FIG. 4, if the angle θ exceeds 70° and reaches 75°, then the number of chippings increases to a large extent. Therefore, the value of the angle θ should be smaller than 75°, and should preferably be equal to or smaller than 70°. If the value of the angle θ is too small, then the first portion corresponding to the device area cannot be sufficiently large. Accordingly, the value of the angle θ should be larger than 45°, and should preferably be 55° or larger.

With the method of processing a wafer and the wafer processed by the method of processing a wafer according to the present embodiment, since the angle formed between the reverse side 11e of the first portion 11c and the inner side surface 11f of the second portion 11d is larger than 45° and smaller than 75°, the wafer is prevented from being chipped off while keeping a wide area for the first portion 11*c* corresponding to the device area.

The present invention is not limited to the embodiment described above, but various changes and modifications may be made in the illustrated embodiment. For example, in the first grinding step according to the above embodiment, when the grinding wheel 12 is lowered, the grinding wheel 12 and the wafer 11 are moved relatively to each other along a direction oblique to the horizontal and vertical directions, thereby forming the angle θ. The present invention is not limited to such a way of moving the grinding wheel 12 and the wafer 11. Instead, when the grinding wheel 12 is to ascend after it has been vertically lowered to grind the wafer 11, the grinding wheel 12 and the wafer 11 may be moved relatively to each other along a direction oblique to the horizontal and vertical directions, thereby to form the angle θ.

In the above embodiment, the protective member applying step and the second grinding step are carried out in addition to the first grinding step. However, the method of processing a wafer according to the present invention may include at least the first grinding step. In other words, the protective member applying step and the second grinding step may be dispensed with if they are not required.

In the second grinding step according to the above embodiment, the grinding wheel 32 and the wafer 11 are moved relatively to each other only in a vertical direction. However, in the second grinding step, the grinding wheel 32 and the wafer 11 may be moved relatively to each other along a direction oblique to the horizontal and vertical directions.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer having on a face side thereof a device area with a plurality of devices formed therein and an outer circumferential excess area surrounding the device area, comprising:

a grinding step for grinding a reverse side of the wafer corresponding to the device area with a grinding wheel that is smaller in diameter than the wafer, thereby forming a first portion corresponding to the device area and an annular second portion surrounding said first portion, said annular second portion being thicker and more protrusive toward a reverse side thereof than said first portion, wherein in the grinding step, said grinding wheel and said wafer are moved relatively to each other so that an angle formed between the reverse side of said first portion and an inner side surface of said annular second portion is larger than 45° and smaller than 75°.

2. The method of processing a wafer according to claim 1, wherein in the grinding step, said grinding wheel and said wafer are moved relatively to each other so that the angle formed between the reverse side of said first portion and the inner side surface of said annular second portion is equal to or larger than 55°, and equal to or smaller than 70°.

\* \* \* \* \*